United States Patent
Yoshino et al.

(10) Patent No.: US 7,789,614 B2
(45) Date of Patent: Sep. 7, 2010

(54) ALIGNER

(75) Inventors: Keisuke Yoshino, Kitakyushu (JP); Mitsuaki Hagio, Kitakyushu (JP); Shin Osaki, Kitakyushu (JP); Yoshihiro Kusama, Kitakyushu (JP)

(73) Assignee: Kabushiki Kaisha Yaskawa Denki, Kitakyushu-shi, Fukuoka (JP)

( * ) Notice: Subject to any disclaimer, the term of this patent is extended or adjusted under 35 U.S.C. 154(b) by 392 days.

(21) Appl. No.: 11/917,076

(22) PCT Filed: May 25, 2006

(86) PCT No.: PCT/JP2006/310433
§ 371 (c)(1),
(2), (4) Date: Dec. 10, 2007

(87) PCT Pub. No.: WO2006/134760
PCT Pub. Date: Dec. 21, 2006

(65) Prior Publication Data
US 2009/0053029 A1    Feb. 26, 2009

(30) Foreign Application Priority Data
Jun. 13, 2005   (JP) .............................. 2005-171772

(51) Int. Cl.
*H01L 21/68*   (2006.01)
*B66C 1/42*    (2006.01)
*C23C 16/00*   (2006.01)

(52) U.S. Cl. ................... 414/783; 414/936; 414/941; 279/4.12; 279/118; 118/730; 294/110.2; 294/116

(58) Field of Classification Search ............... 118/730; 269/228–229, 23; 279/110, 118–119, 141, 279/4.1, 4.12; 294/110.2, 116, 86.25, 86.3, 294/94; 414/217, 217.1, 776, 777, 780, 783, 414/936, 941
See application file for complete search history.

(56) References Cited

U.S. PATENT DOCUMENTS
959,515 A * 5/1910 Grebel .................. 279/118
(Continued)

FOREIGN PATENT DOCUMENTS
JP             11-283957 A       10/1999
(Continued)

OTHER PUBLICATIONS
International Search Report of PCT/JP2006/310433, date of mailing Aug. 8, 2006.
(Continued)

*Primary Examiner*—Gregory W Adams
(74) *Attorney, Agent, or Firm*—Westerman, Hattori, Daniels & Adrian, LLP

(57) ABSTRACT

It is an object to provide an aligner for centering a wafer and adjusting an angle of a notch or the like of the wafer while gripping edges of the wafer capable of attaining a shortened takt time and miniaturization of the apparatus by employing a mechanism capable of infinite rotation without being restricted by a rotational range, by eliminating cables and/or tubes at the rotating portion. The link mechanism for causing opening and closing movements of the gripping mechanism for gripping a wafer 1 is supported via a bearing 14 with respect to the link mechanism driving portion for driving the link mechanism so that only the gripping portion and the link mechanism can be rotated.

6 Claims, 6 Drawing Sheets

U.S. PATENT DOCUMENTS

| | | | | |
|---|---|---|---|---|
| 2,915,814 | A * | 12/1959 | McClean | 29/238 |
| 4,788,994 | A * | 12/1988 | Shinbara | 134/157 |
| 5,566,466 | A | 10/1996 | Hearne | |
| 5,803,521 | A * | 9/1998 | Zejda et al. | 294/97 |
| 5,851,041 | A * | 12/1998 | Anderson et al. | 294/106 |
| 5,990,650 | A * | 11/1999 | Brock | 318/640 |
| 6,435,807 | B1 * | 8/2002 | Todorov et al. | 414/757 |
| 6,491,304 | B2 * | 12/2002 | Sato et al. | 279/2.09 |
| 6,578,853 | B1 | 6/2003 | Treur et al. | |

FOREIGN PATENT DOCUMENTS

| | | |
|---|---|---|
| JP | 2002-43393 A | 2/2002 |
| JP | 2003243294 A | 8/2003 |
| JP | 2004186633 A | 7/2004 |

OTHER PUBLICATIONS

Office Action dated Nov. 3, 2008, issued in corresponding Taiwanese Patent Application No. 095120245.

Japanese Office Action dated Jul. 15, 2010, issued in corresponding Japanese Patent Application No. 2007-521231.

* cited by examiner

ALIGNER

TECHNICAL FIELD

The present invention relates to a pre-aligner for use in production devices or inspection devices for semiconductors, configured to perform centering of a wafer or adjustment of an angle of a notch, or the like, of a wafer.

TECHNICAL BACKGROUND

In a semiconductor production device or the like, a pre-aligner is mainly used in combination with a wafer handling robot and configured to grip a wafer transferred from the robot and detect a cut-out portion formed on an external periphery of the wafer called "notch" or "orientation flat," while rotating the wafer to align the wafer to a prescribed angular orientation based on the detected information, or decide the central position of a wafer (centering).

In accordance with the recent enlargement of an external diameter of a wafer to 300 mm and the problems of wafer back surface particle contamination due to the recent miniaturization of the design rule, in a pre-aligner, it is required that a wafer gripping method be a method of gripping an edge or an end face of a wafer in place of a method of adsorbing a rear surface of a wafer.

An example of a conventional pre-aligner configured to grip an edge of a wafer is disclosed in a Patent Document 1 (Japanese Unexamined Laid-open Patent Publication No. 2003-243294) for example. This conventional wafer gripping method and wafer rotating method will be explained with reference to drawings. FIG. 9 shows a side cross-sectional view showing the aforementioned conventional pre-aligner and FIG. 10 shows a top view showing the gripping mechanism thereof.

In FIGS. 9 and 10, a grip chuck arm 120 is held by a gripping mechanism 121 comprised of two arm bodies 123 each having a generally U-shape as seen from the top with acute angle tip ends and a link for realizing linear motions of gripping portions 124 of the arm bodies 123 in radial directions toward the central axis of the apparatus main body 111 by the operation of a rotation mechanism 122 having a single driving motor 125 as a driving source. This gripping mechanism 121 is supported by a hollow rotary shaft 126 in the apparatus main body 111. The gripping mechanism 121 and the entire arm bodies 123 are configured to be rotated by a belt driving force transmitted from the driving motor 125 in a state in which the gripping portions 124 of the arm tip ends grip the wafer 101 while controlling the direction and angle with a high degree of accuracy. In other words, the gripping mechanism 121 for a wafer 101 is a link mechanism configured to simultaneously move a total of four gripping portions 124 formed on two arm bodies 123 constituting the grip chuck arm 120 in the central direction of the wafer 101 or in the direction opposite to the central direction.

Two arm bodies 123 are placed opposite to each other via the wafer 101. The arm body 123 is provided with a slider 127 which linearly guides the arm body 123 in the arrow X direction. Furthermore, the slider block 128 disposed slidably in the Y-direction perpendicular to the arrow X direction are provided with two link arms 129. The link arm 129 is configured to move the slider 127 in the arrow X direction in accordance with the linear motion of the slider block 128 in the arrow Y direction. Thus, the two arm bodies 123 can perform the gripping/releasing operation of the wafer 101.

Patent Document 1: Japanese Unexamined Laid-open Patent Publication No. 2003-243294 (see claim 5, FIGS. 1 and 2)

DISCLOSURE OF THE INVENTION

Problems to be Solved by the Invention

In the conventional pre-aligner as shown in FIGS. 9 and 10, since it is configured to rotate the entire wafer gripping mechanism as illustrated, the infinite rotation cannot be performed because of the existence of power supplying cables connected to a solenoid 140 which is a gripping operation actuator equipped in this rotary mechanism portion and position detecting cables, resulting in a limited rotational range. Accordingly, in order to align a wafer, since it is required to secure the rotation range for notch detection and the range for rotating the notched position to a prescribed position after the notch detection, the rotation shaft should always be moved to the original position before the alignment operation. Thus, there is a problem that the time required to move the rotation shaft to the original position lengthens the takt time of the apparatus.

Furthermore, various loads such as a torsional load will always be applied to the power supplying cables connected to the solenoid 140 and the position detecting cables. Thus, there is always a risk on durability, such as, e.g., a risk of disconnection or a risk of reduced lifetime.

Furthermore, it is required to make a rotation space for the aforementioned cables (space for accommodating cables) in the apparatus and also required to rotate the entire stage including the actuators of the gripping portions. This requires a capacious motor for use in the rotation mechanism, which in turn makes it difficult to miniaturize the rotation mechanism and also makes it difficult to miniaturize the apparatus.

Furthermore, as to the rotation operation time which takes up the most time of the time required for the alignment, it is difficult to attain high speed rotation because of the high load for rotating the aforementioned stationary entire stage and hollow shaft, which makes it difficult to shorten the alignment time.

The present invention was made in view of the aforementioned problems, and aims to provide a pre-aligner in which a takt time is shortened and a size is reduced by eliminating movements of cables.

Means to Solve the Problems

In order to solve the aforementioned problems, the present invention is constituted as follows.

The invention as recited in claim 1 is directed to a wafer aligner comprising a gripping mechanism for gripping an external periphery of a wafer by an open and close operation, a rotating mechanism for rotating the gripping mechanism gripping the wafer, and a detection sensor mechanism for detecting a cut-out and the external periphery of the wafer, the wafer aligner further comprises:

a link mechanism for causing horizontal opening and closing movements of the gripping mechanism; and a link mechanism driving portion for driving the link mechanism, wherein the link mechanism driving portion rotatably supports the link mechanism on a wafer rotating shaft.

In the invention as recited in claim 2, the link mechanism driving portion supports the link mechanism with a bearing.

In the invention as recited in claim 3, the rotating mechanism is configured to rotate only the gripping mechanism gripping the wafer and the link mechanism.

In the invention as recited in claim 4, the rotating mechanism is driven by a servo motor.

In the invention as recited in claim 5, the link mechanism causes opening and closing movements of the gripping mechanism by converting vertical movements of the link mechanism driving portion into horizontal movements.

In the invention as recited in claim 6, the vertical movements of the link mechanism driving portion are driven by an air cylinder.

In the invention as recited in claim 7, the vertical movements of the link mechanism driving portion are driven by a horizontal moving mechanism which moves horizontally.

In the invention as recited in claim 8, the vertical movements of the link mechanism driving portion are driven by rolling a roller on a paddle having an inclined surface provided at the horizontal moving mechanism.

In the invention as recited in claim 9, the horizontal moving mechanism is driven by an air cylinder.

According to the present invention, the following effects can be attained.

(1) Since the link mechanism for closing/opening the wafer gripping mechanism is supported by the link mechanism driving portion via the rotary bearing, only the wafer gripping mechanism and the link mechanism can be rotated. This eliminates conventional cables for a driving source of the gripping mechanism in the rotating portion, which makes it possible to rotate the gripping mechanism endlessly without being restricted in rotation range. Accordingly, this eliminates the need for the movement operation of the gripping mechanism in the rotation direction to the original position required in every wafer alignments, which makes it possible to receive and align a wafer immediately after the transferring of the wafer to a wafer handling robot, resulting in a shortened takt time.

(2) A risk on durability, such as, e.g., a risk of disconnection of cables for a power source of the gripping mechanism or a risk of reduced lifetime of such cables, can be eliminated.

(3) Since only the wafer gripping mechanism and the link mechanism can be rotated, the rotation space for the rotation mechanism can be miniaturized, which makes it possible to substantially reduce the thickness of the apparatus in the up-and-down direction.

(4) Since the rotation load can be reduced, a high-speed alignment operation can be performed.

(5) In cases where the vertical movements of the link mechanism driving portion are performed by the horizontal movement mechanism which moves horizontally, the entire apparatus can be further reduced.

DESCRIPTION OF REFERENCE NUMERALS

Figure 1A:
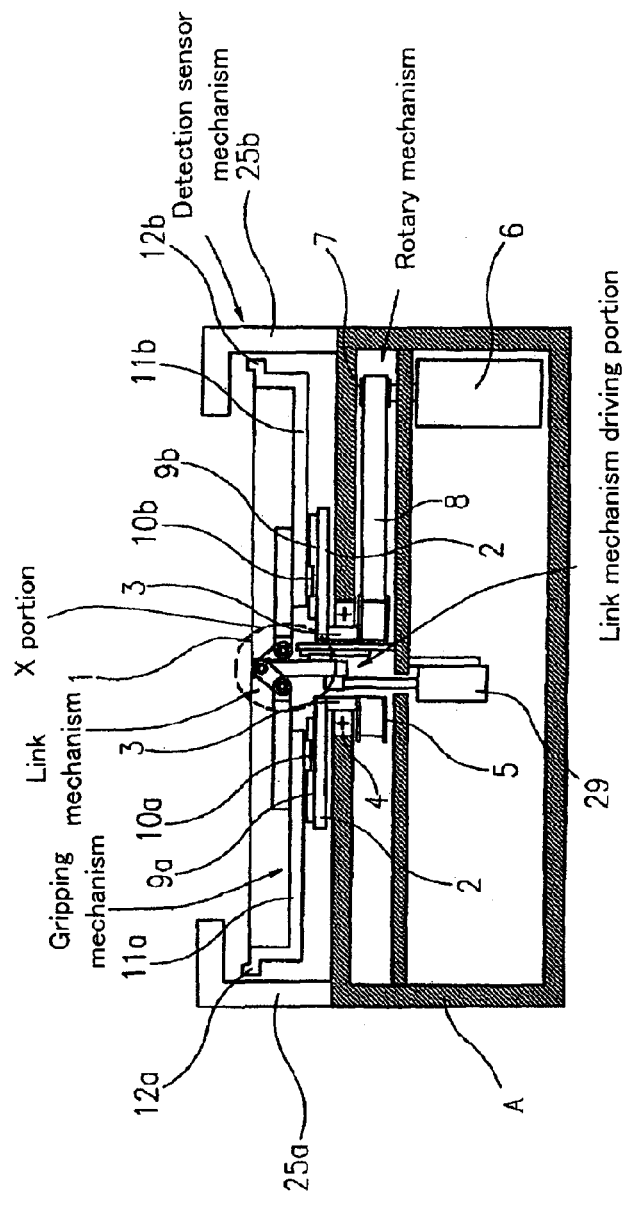
FIG. 1 is a side cross-sectional view of a pre-aligner of Embodiment 1.

A aligner main body
0 main body
1 wafer
2 rotation base
3 rotation shaft
4 bearing
5 pulley
6 rotating motor
7 pulley
8 timing belt
9 linear guide rail
10 slider
11 clamp arm
12 damper
13 link bar A
14 bearing
15 link bar B
16 bearing
17 link bar C
18 bearing
19 link bar D
20 roller
21 linear guide rail
22 slider
23 compression spring
24 paddle
25 detection sensor
26 automatic switch
17 slider
28 linear guide rail
29 cylinder
30 cylinder
101 wafer
111 apparatus main body
120 grip chuck arm
121 gripping mechanism
122 rotation mechanism
123 arm main body
124 gripping portion
125 driving motor
127 slider
128 slider block
129 link arm

BEST MODE FOR CARRYING OUT THE INVENTION

Hereinafter, some embodiments of the present invention will be explained.

Embodiment 1

Figure 1B:
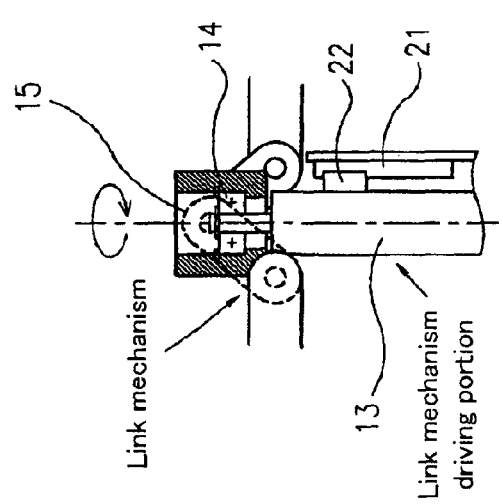
Figure 2:
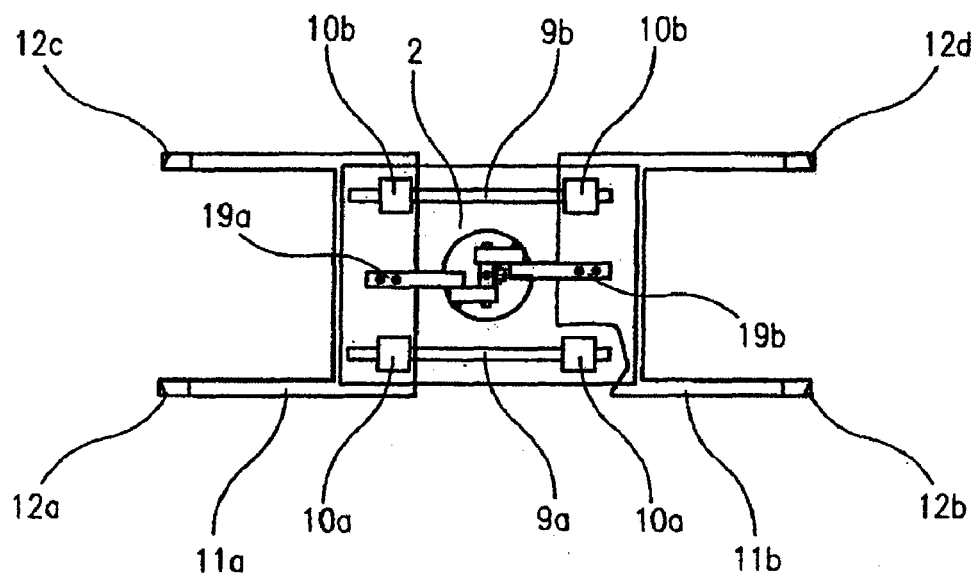
FIG. 2 is a top view of the gripping mechanism of the pre-aligner of Embodiment 1.
Figure 3:
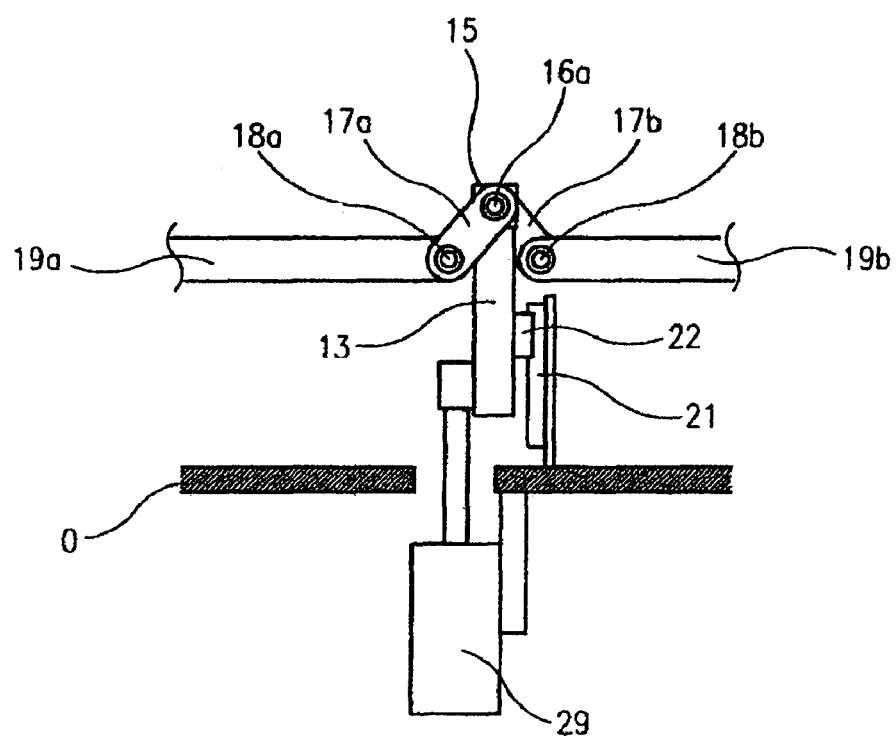
FIG. 3 is a side view showing the link structure of the gripping mechanism of the pre-aligner of Embodiment 1.
Figure 4:
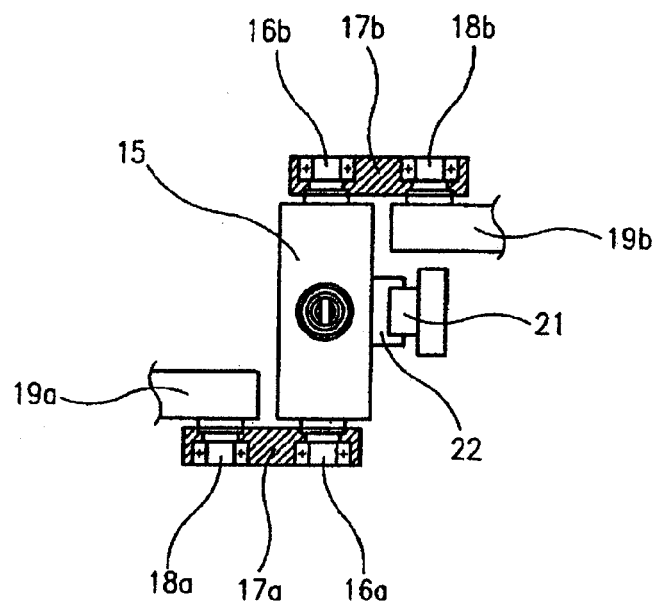
FIG. 4 is a top view showing the link structure of the gripping mechanism of the pre-aligner of Embodiment 1.
Figure 5:
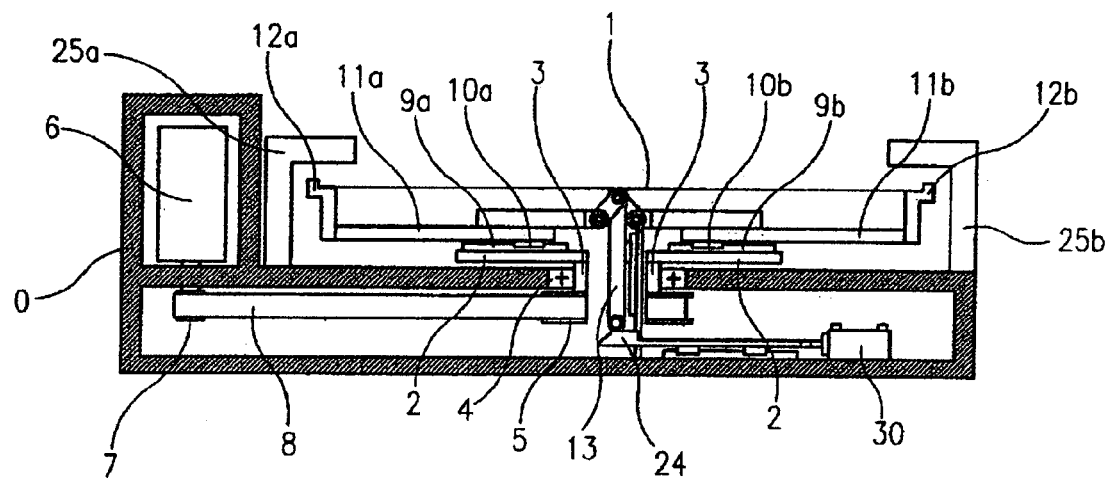
FIG. 5 is a side cross-sectional view a pre-aligner of Embodiment 2.
Figure 6:
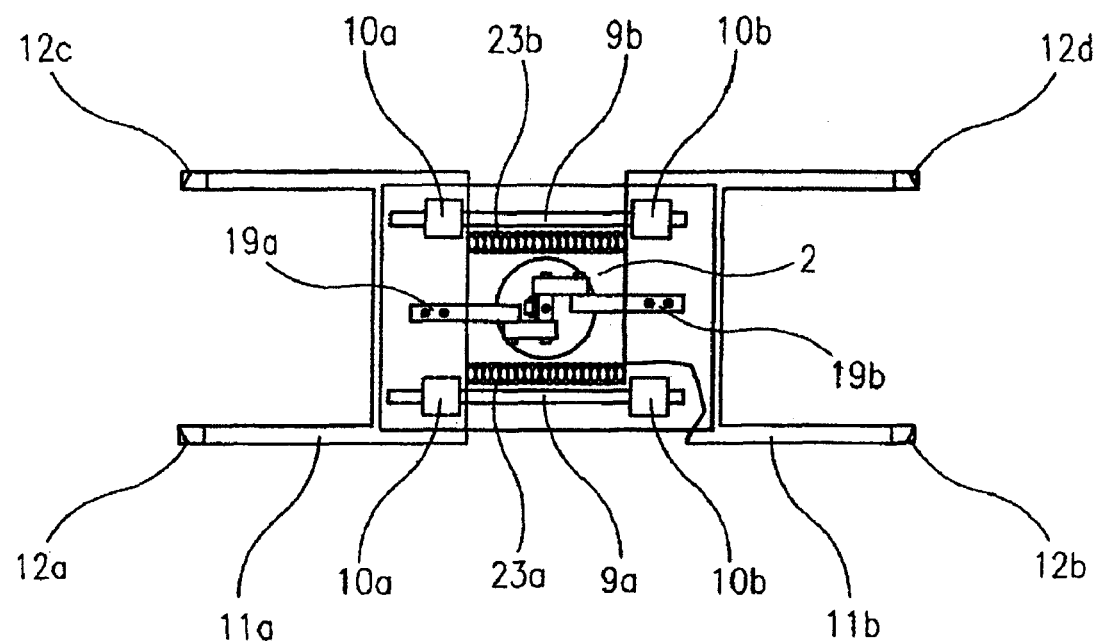
FIG. 6 is a top view of the gripping mechanism of the pre-aligner of Embodiment 2.
Figure 7:
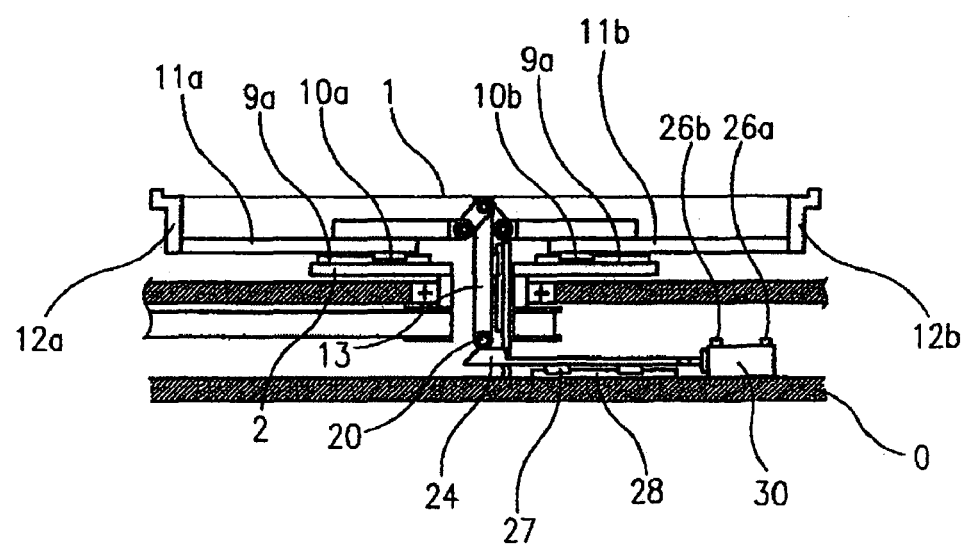
FIG. 7 is a side view of the gripping mechanism of the pre-aligner of Embodiment 2.
Figure 8:
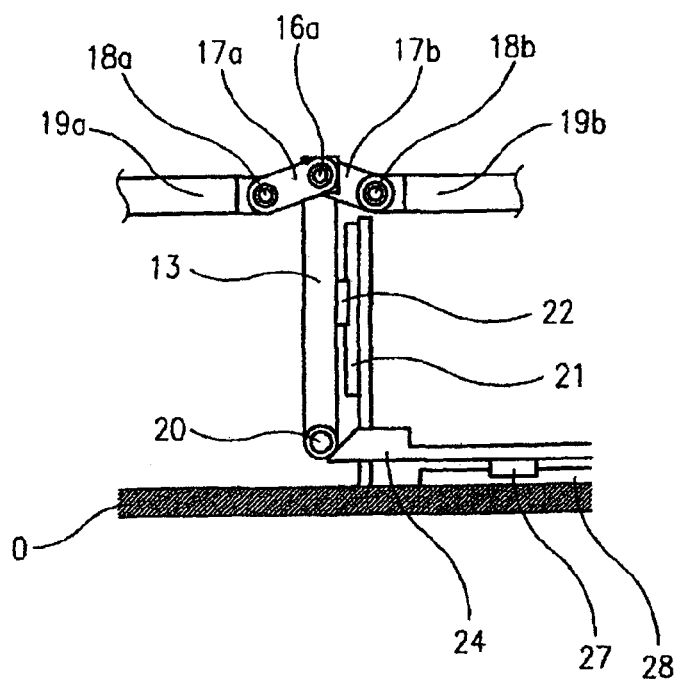
FIG. 8 is a side view showing the link structure of the gripping mechanism of the pre-aligner of Embodiment 2.
Figure 9:
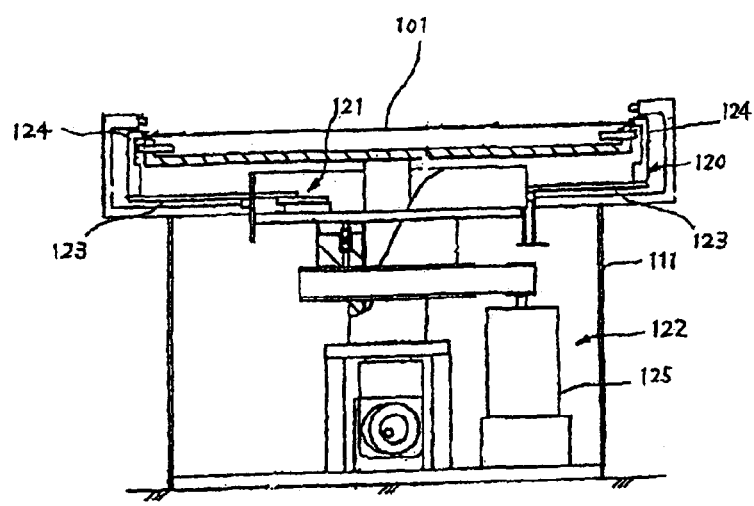
FIG. 9 is a side cross-sectional view of a conventional pre-aligner.
Figure 10:
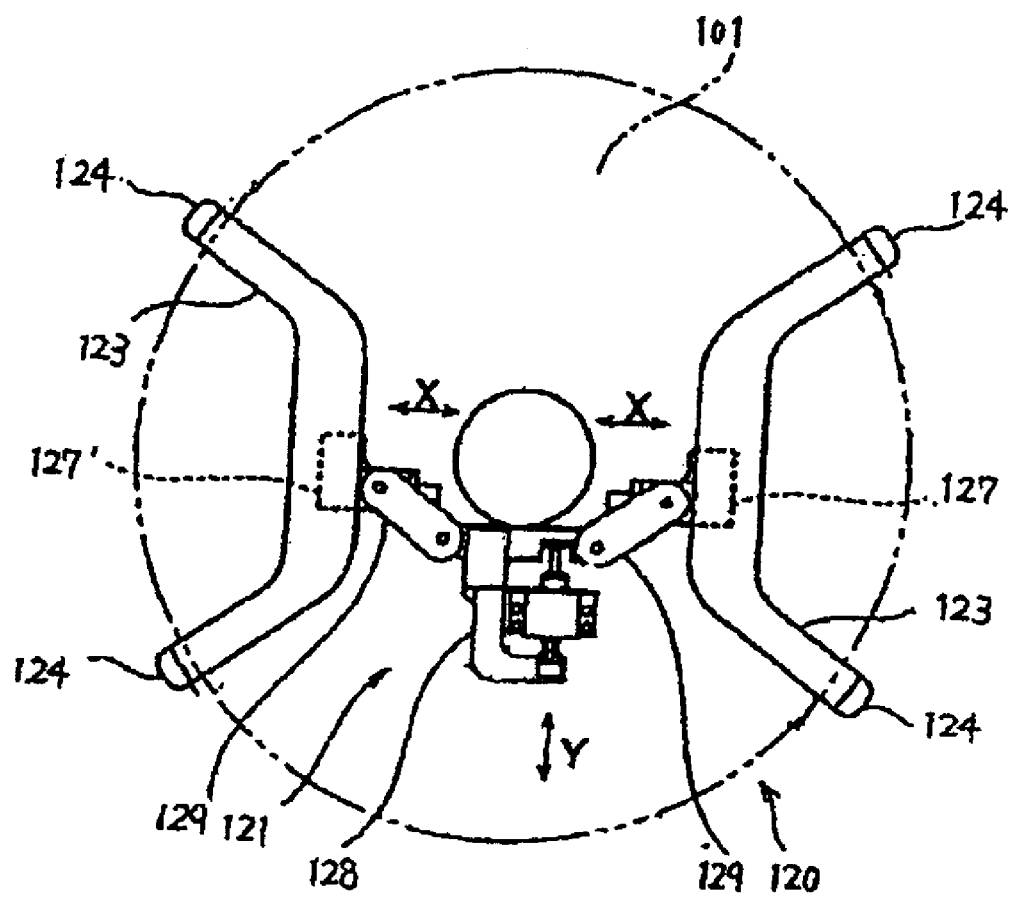
FIG. 10 is a top view showing a gripping mechanism of a conventional pre-aligner.

Hereinafter, a first embodiment of a pre-aligner of the present invention will be explained with reference to the following drawings. FIG. 1 is a side cross-sectional view of a pre-aligner according to Embodiment 1. FIG. 2 is a top view of the gripping mechanism of the pre-aligner of Embodiment 1. FIG. 3 is a side view showing the link structure of the gripping mechanism of the pre-aligner of Embodiment 1. FIG. 4 is a top view showing the link structure of the gripping mechanism of the pre-aligner of Embodiment 1. FIG. 5 is a side cross-sectional view a pre-aligner of Embodiment 2. FIG. 6 is a top view of the gripping mechanism of the pre-aligner of Embodiment 2. FIG. 7 is a side view of the gripping mechanism of the pre-aligner of Embodiment 2. FIG. 8 is a side view (clamper opened state) showing the link structure of the gripping mechanism of the pre-aligner of Embodiment 2.

The structure of the present invention will be explained with reference to FIGS. 1 to 8. Reference numeral 1 denotes a wafer, Reference numeral 2 denotes a rotary base which is supported rotatably, with respect to the aligner main body A, by a bearing 4 together with a cylindrical hollow rotary shaft 3 located at the lower side of the rotary base 2 and a pulley 5 having a hollow aperture disposed concentrically to the rotary base 2. The pulley 5 is connected to a pulley 7 attached to the shaft end of a position detectable rotating motor 6 such as a servo motor via a timing belt 8. Thus, it is constituted such that the rotary base 2 can be rotated in accordance with the rotation of the rotating motor 6.

On the rotary base 2, linear guide rails 9a and 9b are mounted horizontally. To the horizontally movable sliders 10a and 10b engaged with the linear guide rails, clamp arms 11a and 11b are fixed. Thus, the clamp arms 11a and 11b are movable on the straight line together with the sliders. The rotary base 2 is provided with a hole in the central portion thereof in order to transfer, to the clamp arms 11a and 11b, the movements of the link bar A 13 of the link mechanism which will be explained later. The link mechanism and the clamp arms 11a and 11b are connected above the rotary base 2.

The clamp arms 11a and 11b are provided with a total of four dampers 12a, 12b, 12c and 12d in a symmetrical manner. The dampers 12a, 12b, 12c and 12d are capable of gripping a wafer by clamping the edge portions thereof. The clampers 12a, 12b, 12c and 12d are formed to have a circular shape along the wafer external diameter so that the wafer center conforms to the rotary center of the rotary base 2 when the clampers grip the wafer 1 by the linear movements of the clamp arms 11a and 11b.

A link bar A 13 is disposed on the rotary center of the rotary base 2. The link bar A 13 is connected to the slider 22 engaged with a linear guide rail 21 vertically mounted to the aligner main body A within the inside of the rotary shaft 3 and the hollow hole of the pulley 5 so that the link bar is movable vertically. The one end portion of the link bar A 13 is formed into a cylindrical shape and provided with a bearing 14 so as to coincide with the rotary center. The one end portion of the link bar A 13 is connected to a link bar B 15 via the bearing 14.

Each of both ends of the link bar B 15 is formed into a cylindrical shape and connected to link bars C 17a and 17b via bearings 16a and 16b and further connected to link bars D 19a and 19b via bearings 18a and 18b. The link bars D 19a and 19b are fixed to clamp arms 11a and 11b.

The link bar A 13, link bar B 15, link bars C 17a and 17b, and the link bars D 19a and 19b constitute a link mechanism. It is constituted such that the up-and-down movements of the link bar A 13 cause horizontal movements of ends of the link bar C 17a and 17b due to the horizontal directional restriction of the sliders 10a and 10b engaged with the linear guide rails 9a and 9b and the functions of the bearings 16a, 16b, 18a and 18b equipped to the link bars C 17a and 17b. In Embodiment 1, one end of the link bar A 13 is connected to a cylinder 29 so that the protruding and retreating movements of the cylinder 29 cause up-and-down movements of the link bar A 13.

Embodiment 1 is an embodiment which can be preferably used for the purpose of decreasing the installation area of the apparatus.

In Embodiment 2, the link bar A 13 is provided with a roller 20 at the lower end thereof. A paddle 24 having an inclined surface with which the roller 20 comes into contact is fixed to a slider 27 engaging with the linear guide rail 28 mounted on the aligner main body A and also connected to a horizontally disposed cylinder 30. The protruding movement of the cylinder 30 causes a horizontal movement of the paddle 24 toward the rotational center, causing a rolling movement of the roller 20 on the inclined surface of the tip end of the paddle 24, which in turn causes a raising movement of the link bar A 13.

Compression springs 23a and 23b are disposed between the clamp arms 11a and 11b to apply outward urging loads to the clamp arms 11a and 11b. Accordingly, a downward load is always applied to the link bar A 13 via the link bars C 17a, 17b and the link bar B 15. As a result, even if the inclined portion of the paddle 24 is moved in accordance with the retreat movement of the cylinder 30, the roller 20 is always kept in contact with the inclined portion of the tip end of the paddle 24 and descends.

In this Embodiment 2, since the cylinder 30 is horizontally disposed via the roller 20, the paddle 24, the sliders 27, and the linear guide rails 28, it can be preferably used for the purpose of decreasing the height of the apparatus.

Furthermore, the pre-aligner main body is provided with detection sensors 25a and 25b for detecting notch portions formed on the external periphery of the wafer in such a way that the detection sensors are placed so as to be opposed with each other about the rotational center at a 180-degree angle.

Next, the operation of the aforementioned aligner will be explained.

Initially, the operation of mounting a wafer on this apparatus will be explained.

In Embodiment 1, the retreating movement of the cylinder 29 causes a descending movement of the link bar A 13 fixed to the slider 22 engaging with the linear guide rail 21, resulting in outward movements of the link bars C 17a and 17b, which in turn causes outward movements of the clamp arms 11a and 11b to open the clampers 12a, 12b, 12c and 12d. Thus, it becomes possible to mount a wafer.

In Embodiment 2, the retreating movement of the cylinder 30 causes an outward movement of the paddle 24. Then, the link bar A 13 vertically supported by the rotation center tip end portion of the paddle 24 and the slider 22 engaged with the linear guide rail 21 goes down along the inclined portion of the paddle 24 via the roller 20 provided at the lower end of the link bar A 13, causing a downward movement of the link bar A 13, which in turn causes outward movements of the clamp arms 11a and 11b via the link bar B 15 and the link bars C 17a and 17b while being urged by the springs 23a and 23b applying outward forces with respect to the rotational center.

In either Embodiment, the wafer gripping portions constituted by a total of four clampers 12a, 12b, 12c and 12d stop at the position slightly outside the external diameter of the wafer. An automatic switch 26a, (not illustrated), attached to the cylinder 30 confirms completion of the opening operations of the clamper 12a, 12b, 12c and 12d. While keeping this state, a wafer handling robot (not illustrated), transfers a wafer on the clampers 12a, 12b, 12c and 12d.

Next, the wafer gripping operation of this apparatus in which a wafer is mounted will be explained.

In Embodiment 1, the protruding movement of the cylinder 19 causes an upward movement of the link bar A 13 fixed to the slider 22 engaging with the linear guide rail 21, resulting in inward movements of the link bars C 17a and 17b toward the center of the device, which in turn causes inward movements of the clamp arms 11a and 11b to close the clampers 12a, 12b, 12c and 12d. Thus, the wafer gripping operation is completed.

In Embodiment 2, the protruding movement of the cylinder 30 causes an outward movement of the paddle 24 fixed to the slider 28 on the linear guide rail 27. Then, the link bar A 13 vertically supported by the linear guide rail 21 and the slider 22 goes up along the inclined portion of the paddle 24 via the roller 20 provided at the lower end of the link bar A 13, causing an upward movement of the link bar A 13, which in turn causes closing movements of the clamp arms 11a and 11b while resisting the springs 23a and 23b applying outward forces with respect to the rotational center. A wafer is gripped when the wafer gripping portion, constituted by a total of four clampers 12a, 12b, 12c and 12d, is closed, and an automatic switch 26b (not illustrated), attached to the cylinder 30 confirms completion of the gripping operation by the clamper 12a, 12b, 12c and 12d.

Next, the alignment operation of the apparatus in which a wafer gripping operation has been completed will be explained.

The inner ring of the bearing 4 is rotated by the rotating motor 6 via the pulley 7, the timing belt 8 and the pulley 5, which causes a rotational movement of the connecting part 3 which is in contact with the inner ring of the bearing 4, the rotary base 2 and the clamp arms 11a and 11b. At this time, the positional relation between the rotary mechanism and the gripping mechanism is as follows. That is, the gripping mechanism below the link bar B 15 is not rotated since the bearing 4, the connecting part 3, the linear guide rail 21 constituting a link mechanism of the gripping mechanism located at the hollow portion of the rotary base 2, the vertically disposed link bar A 13 fixed to the slider 22, and the link bar B 15 constituting the horizontal gripping link mechanism are interposed by the bearing 14.

At this time, while rotating the wafer 1 mounted on the clampers 12a, 12b, 12c and 12d, by 180-degrees, two detection sensors 25a and 25b detect the notch or the orientation flat formed on the external periphery of the wafer 1. After calculating the notch detection timing by the detection sensors 25a and 25b, the encoder information equipped with the rotary motor 6 and the rotation amount of the notch to a prescribed position by the upper controller (not illustrated), the notch is moved to the prescribed position to complete the alignment operation.

Thereafter, a wafer handing robot (not illustrated), moves the wafer from this apparatus to complete the series of alignment operations.

In the case of aligning the subsequent wafer, the alignment can be continuously initiated from the current position without returning the rotary shaft to the original position.

INDUSTRIAL APPLICABILITY

The present invention can be preferably applied to a production apparatus and an inspection apparatus for semiconductors which requires to grip an external periphery of a disk-shaped object and rotate the object, such as, e.g., a pre-aligner used for centering a wafer or adjusting an angle of the notch or the like.

What is claimed is:

1. A wafer aligner comprising a gripping mechanism for gripping an external periphery of a wafer by an open and close operation, a rotating mechanism for rotating the gripping mechanism gripping the wafer, and a detection sensor mechanism for detecting a cut-out and the external periphery of the wafer, the wafer aligner further comprises:
a link mechanism for causing horizontal opening and closing movements of the gripping mechanism; and
a link mechanism driving portion for driving the link mechanism,
wherein the link mechanism driving portion rotatably supports the link mechanism on a wafer rotating shaft,
wherein the link mechanism causes opening and closing movements of the gripping mechanism by converting vertical movements of the link mechanism driving portion into horizontal movements,
wherein the vertical movements of the link mechanism driving portion are driven by a horizontal moving mechanism which moves horizontally, and
wherein the vertical movements of the link mechanism driving portion are driven by rolling a roller on a paddle having an inclined surface provided at the horizontal moving mechanism.

2. The wafer aligner as recited in claim 1, wherein the link mechanism driving portion supports the link mechanism with a bearing.

3. The wafer aligner as recited in claim 1, wherein the rotating mechanism is configured to rotate only the gripping mechanism gripping the wafer and the link mechanism.

4. The wafer aligner as recited in claim 1, wherein the rotating mechanism is driven by a servo motor.

5. The wafer aligner as recited in claim 1, wherein the vertical movements of the link mechanism driving portion are driven by an air cylinder.

6. The wafer aligner as recited in claim 1, wherein the horizontal moving mechanism is driven by an air cylinder.

* * * * *